Nov. 1, 1966 R. S. LEVITT ET AL 3,283,160

PHOTOELECTRONIC SEMICONDUCTOR DEVICES COMPRISING AN INJECTION LUMINESCENT DIODE AND A LIGHT SENSITIVE DIODE WITH A COMMON N-REGION

Filed Nov. 26, 1963 2 Sheets-Sheet 1

INVENTORS
RALPH S. LEVITT
KURT WEISER

BY George Baum
ATTORNEY

Nov. 1, 1966 R. S. LEVITT ETAL 3,283,160

PHOTOELECTRONIC SEMICONDUCTOR DEVICES COMPRISING AN INJECTION LUMINESCENT DIODE AND A LIGHT SENSITIVE DIODE WITH A COMMON N-REGION

Filed Nov. 26, 1963 2 Sheets-Sheet 2

3,283,160

PHOTOELECTRONIC SEMICONDUCTOR DEVICES COMPRISING AN INJECTION LUMINESCENT DIODE AND A LIGHT SENSITIVE DIODE WITH A COMMON N-REGION

Ralph S. Levitt, Ossining, and Kurt Weiser, Millwood, N.Y., assignors to International Business Machines Corporation, New York, N.Y., a corporation of New York Filed Nov. 26, 1963, Ser. No. 326,171
10 Claims. (Cl. 250—213)

This invention relates to light coupled switches and to amplifiers, and more particularly to switches, light amplifiers and image converters that employ diodes having negative resistance and electroluminescent properties.

In a copending application, filed on November 26, 1963, in the names of the instant inventors and William P. Dumke, Serial No. 326,114, entitled, "Solid State Light Emissive Diodes Having Negative Resistance Characteristics," and assigned to the same assignee as the assignee of this application, an electroluminescent negative resistance diode is described. However, in such latter application there is no treatment of how an electroluminescent diode having negative resistance characteristics can be employed either as a light amplifier, as a switch, or as an image converter. In the present invention, impurities having good electroluminescent properties as well as being able to produce deep levels in the forbidden gap are employed. A diode is prepared by diffusing Mn into an n-type GaAs, followed by a much shallower Zn diffusion into the GaAs. The diode is constructed so as to have a high resistivity p-region (P°) in which a predominant impurity is Mn. The high resistivity region is flanked on one side by a low resistivity n-region and on the other side by a low resistivity p-region. In the low resistivity p-region (P) the dominant impurity is Zn.

It has been found when such a diode is biased in the forward direction, the forward or easy direction of current flow can be rapidly switched from a low conducting state to its high conducting state through a negative resistance region. Such a diode emits light in either of its states, but more intensely in its high conduction state. By employing a proper bias, the diode can rapidly switch from a low current state to a high current state by externally illuminating the diode. If the light intensity of the external stimulating light is less than the emitted light intensity which takes place during switching, then a light amplification has resulted. The present invention exploits this feature to attain either light amplification or image conversion.

It is an object of the present invention to employ electroluminescent diodes in a light amplification system.

It is another object to obtain light amplification employing diodes wherein the stimulating light is of a longer wavelength than the emitted light of the switching diode.

It is yet another object to obtain a rapid switching solid state bistable device.

The foregoing and other objects, features and advantages of the invention will be apparent from the following more particular description of preferred embodiments of the invention, as illustrated in the accompanying drawings.

In the drawings:

FIGURE 1 is an embodiment of the invention employed as a solid state photon coupled switch.

FIGURES 2, 3 and 3*a* are plots of current vs. voltage of the diode of FIGURE 1 employed to aid in an understanding of the operation of FIGURE 1.

Figure 5:
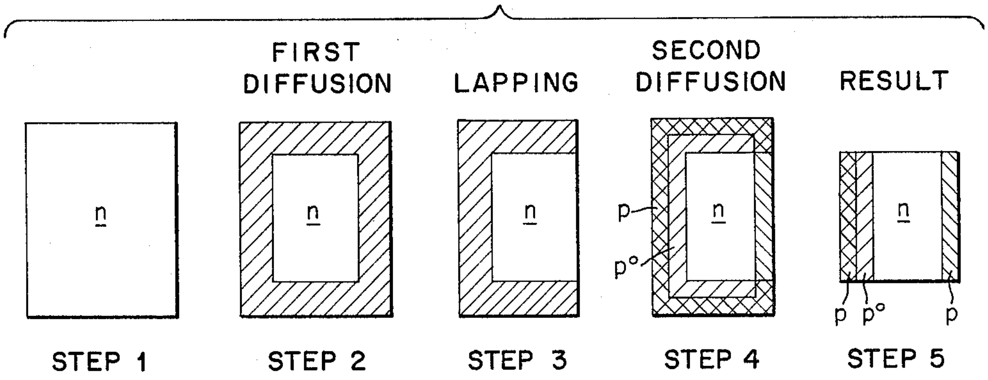
FIGURE 5 is a schematic diagram of the method of making the electroluminescent diode employed in the invention.

The fabrication of the solid state device employed in the present light amplifier circuit is shown in FIGURE 5. Starting from left to right, FIGURE 5 discloses an n-type slab of material having the proper donor concentration. An exemplary material would be GaAs indicated as N in FIGURE 1. Diffused into the GaAs is a p-type acceptor impurity, the latter surrounding the n-type material as shown in step 2 of FIGURE 5. An example of such a p-type material would be Mn. The diffused slab comprising the GaAs and Mn is then ground, lapped, etched or otherwise treated so as to remove the diffused layer of Mn on only one side of the slab, thus exposing the n-type material such as GaAs.

A second diffusion step takes place wherein another p-type surface layer is diffused into the structure shown in the fourth step of FIGURE 5. Such diffusion layer would be made of Zn. The depth of the second diffusion is chosen commensurate with the characteristics desired for the final device. The second p-type layer comprises a shallow level acceptor impurity as compared with the deeper level impurity of Mn, Zn being one chosen as suitable for describing the embodiment chosen to illustrate the invention. The resulting slab is then treated to remove the edges to expose a multilayer device having a top p-layer (P), a second layer of semi-insulating material which will ultimately serve as a high resistance region (P°), an innermost n-type region (N) and finally a bottom p-layer (P). In an actual case employing GaAs and Mn and Zn as the impurities, a GaAs wafer having a carrier concentration of $2–4\times10^{17}$ cm.$^{-3}$ was polished to a mirror finish and encapsulated in evacuated quartz ampoules together with chips of Mn metal. Diffusions were carried out at 900° C. for 4 hours resulting in junction depths of about 4 mils. The p-n junctions were revealed by electrolytic etching in dilute KOH solutions. The wafers were then re-encapsulated in quartz but with chips of Zn metal, and rediffusion took place at 900° C. for periods from 15 to 45 minutes. The time and temperature of the Zn diffusion were chosen so as to keep the Zn penetration much smaller than the Mn penetration. The second diffusion did not change the position of the initial junction formed by GaAs and Mn.

The wafer was then cleaved into parallelepipeds of the dimensions of 10 x 5 x 5 mils. Ohmic contacts were made using tin on the n-side of the wafer and indium on the p-side of the wafer.

Figure 6:
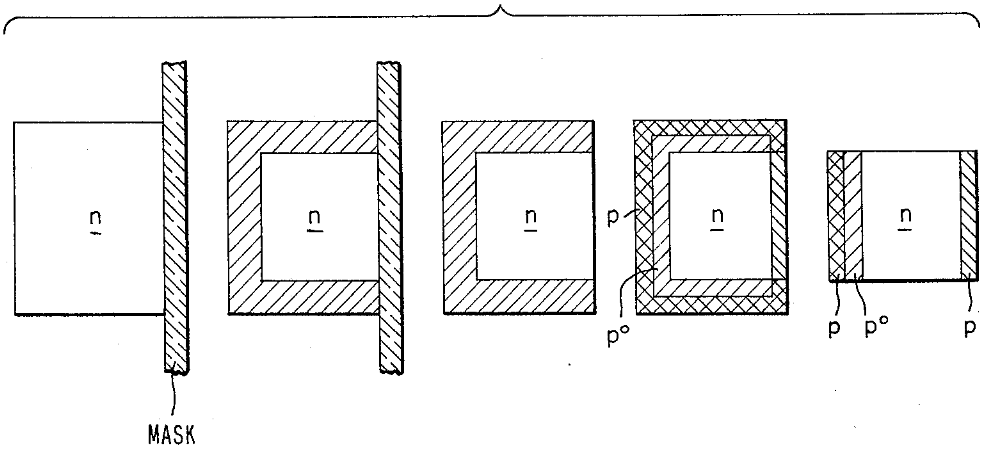
FIGURES 6 and 7 are variations of the method of fabrication of such diode.

An alternative method of making the PP°NP device employed in this invention is to follow the steps shown in FIGURE 6. In FIGURE 6, the diffusion of the Mn into the GaAs takes place through a mask. After the second diffusion takes place through a mask, the edges can be removed from the multilayer device in the same manner as is shown in FIGURE 5. The use of a mask obtains a PP°NP structure without the need to resort to the grinding, lapping or etching of step 3 of FIGURE 5.

Figure 7:
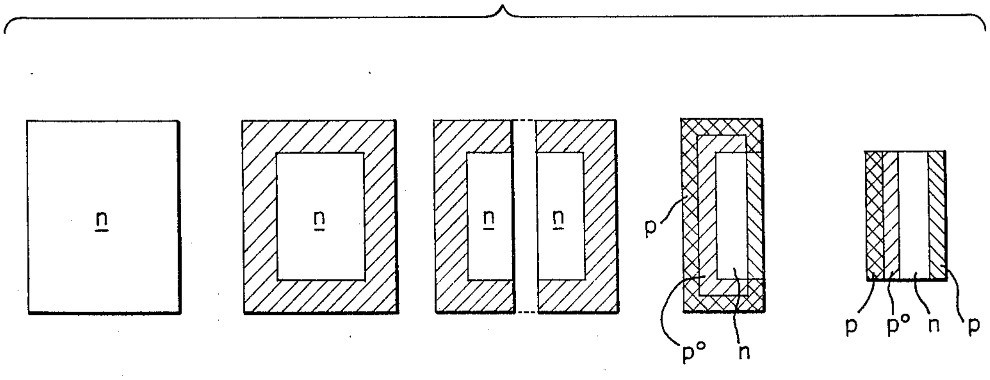

As shown in FIGURE 7, the first two steps for fabricating the diode employed in the present invention are similar to the steps shown in FIGURE 5. Instead of lapping one edge of the Mn to expose the GaAs wafer, the entire wafer is cut in two as shown in step 3 of FIGURE 7. Now both sections of the cut wafer can be treated either by the method shown in FIGURE 5 or FIGURE 7 to obtain two PP°NP devices.

Figure 1:
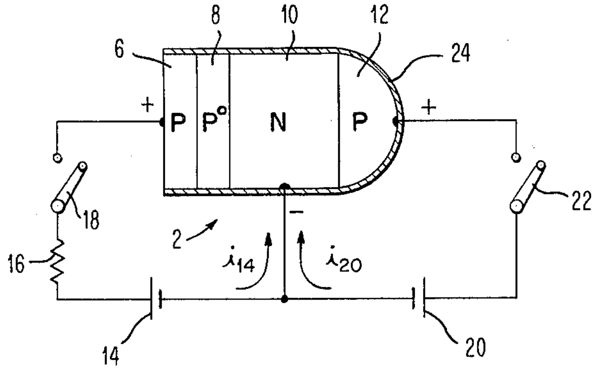

FIGURE 1 sets forth a semiconductor device capable of rapidly switching sizable currents. The overall device 2 is composed of a GaAs crystal flanked on one side by an injection luminescent diode and on the other side by a light-sensitive PP°N negative resistance diode so that the emitted photons of the luminescent diode control the resistance of the PP°N diode. The coupling is achieved by fabricating both units so that they have a common n-type region N. In making the GaAs as described hereinabove, one obtains a layer 6 which contains Zn (or other shallow acceptors such as cadmium) as the dominant impurity within the GaAs wafer and forms a p-type low impedance region (P). Layer 8 forms the insulating or high impedance region designated as P° and comprises Mn (or other deep acceptors such as chromium) as the main impurity. Region 10 is the n-type GaAs layer designated as N and region 12 is another low impedance region designated as P wherein the dominant impurity, like layer 6, is Zn.

Battery 14 supplies, through load resistor 16 and switch 18 (when closed), a forward bias to the PP°N diode region 6, 8 and 10. Battery 20 supplies through switch 22 (when closed) a potential in the forward direction of the injection luminescent diode comprising regions 10 and 12 that is sufficient to cause such diode to luminesce. A reflective coating 24 is applied to the outer surface of P region 12 so as to reflect such luminescent light toward the P° region 8. However, the device works even in the absence of such coating 24.

Figure 2:
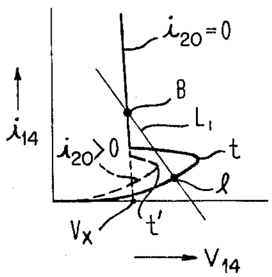

Operation of the PP°NP photon coupled switch of FIGURE 1 will now be described in conjunction with the $i_{14}$–$V_{14}$ plots shown in FIGURES 2 and 3. Regions 6, 8 and 10 comprise a structure which exhibits a negative resistance when biased in the forward direction by voltage $V_{14}$ of battery 14. With switch 18 closed and a low value of $+V_{14}$ applied, the impedance of the PP°N diode is very high due to region 8 so that point $l$ of the curve $i_{20}=0$ of FIGURE 2 represents the high impedance stable state of the negative resistance electroluminescent diode portion of the device. When $V_{14}$ is increased to point $t$, the threshold voltage of the negative resistance electroluminescent diode, the latter switches and the $i_{14}$–$V_{14}$ curve $i_{20}=0$ shows negative resistance characteristics. A stable state, represented by point B, is the low impedance state of the negative resistance electroluminescent diode.

The latter also has the characteristic that energy, in the form of light, when applied to the high resistance region P°, will lower the voltage threshold of the diode. Curve $i_{20}>0$ of FIGURE 2 is a plot of $i_{14}$–$V_{14}$ when light which is generated by current $i_{20}$, flowing across the P–N junction 10–12, is incident upon the P° region of diode 6–8–10. It is seen that switching of the negative resistance electroluminescent diode occurs at a lower voltage $t'$ due to such applied light. Point B is substantially the same low impedance stable state position of the diode whether the diode is operated under dark conditions or with light applied to the P° region. When desired, the diode 6–8–10 is returned to its first stable state (point $l$) by removing the illumination and momentarily opening switch 18. Other means, for example, negative pulses, can be employed to momentarily reduce the bias $V_{14}$ so that the diode voltage becomes less than $V_x$ so as to return the diode 6–8–10 to its high impedance state (point $l$). $L_1$ is the operating load line of the negative resistance electroluminescent diode.

In summary, once the diode 6–8–10 is in its low impedance state B, the forward voltage bias across diode 6–8–10 must be reduced momentarily below the value $V_x$ to return the diode to its high impedance state as indicated by point $l$. PP°N region of FIGURE 1 is important because it acts as a negative resistance switch. Its electroluminescent property is incidental to the switching process, but such property is desirable when one wishes to employ optical means for reading out non-destructively the state of the photon coupled switch. The light due to electroluminescence can be sensed without destroying the state in which the diode is in, namely, its high impedance or low impedance state.

It should be noted that the manufacture of two diodes with a common base N-region 10 permits very close coupling between an injection luminescent diode (regions 10 and 12) and a negative electroluminescent diode (regions 6, 8 and 10) so that rapid switching of the negative resistance electroluminescent diode can take place. Switching times of at least as fast as $10^{-7}$ sec. are achieved by this device. The device of FIGURE 1 acts as a very fast three terminal switch or relay wherein current $i_{20}$ serves as the control current. The turn on time of the light produced by diode 10–12 is at least as fast as $10^{-9}$ sec. and its intensity, over a wide range, is proportional to the current $i_{20}$.

Figure 3:
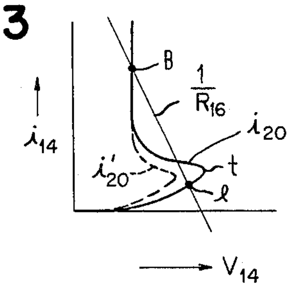
Figure 3A:
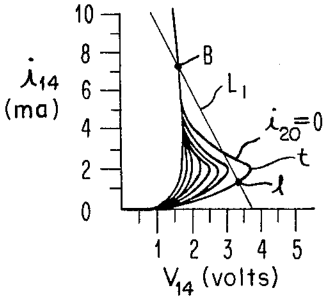

FIGURE 3*a* shows an $i$–V plot of the switching device of FIGURE 1 for various values of $i_{20}$ as $i_{20}$ is increased in steps of 5 ma. $R_{16}$ was chosen as 200 ohms and the batteries 14 and 20 of FIGURE 1 were replaced by time-varying generators. The $i$–V curves were obtained on a 575 curve tracer manufactured by Tektronix with the switching device maintained at a temperautre of 77° K. The threshold voltage varies from 3.8 volts to 1.5 volts and the current $i$ at threshold varies from 1.0 to 2.5 ma.

As seen in FIGURE 3, the gain of the PP°N device can be written as follows:

$$\text{gain}=\frac{i_B}{i_1}$$

or the ratio of the current carried by the diode 6–8–10 in its low impedance state to the current carried in its high impedance state. This gain can also be expressed by the ratio $$\frac{R_{PP^\circ N}+R_{16}}{R_{16}}$$

where $R_{16}$ is the resistance of the load impedance 16 of FIGURE 1 and $R_{PP^\circ N}$ is the impedance of the diode 6–8–10. The gain of the entire system (PP°NP) can be written as $$\frac{\Delta i_{14}}{\Delta i_{20}}$$

or $$\frac{i_{14}\text{ (at point }B)-i_{14}\text{ at point }l)}{i'_{20}-i_{20}}$$

As seen in FIGURE 3, $i_{20}=0$ (no light) and $i'_{20}$ of the order of milliamps, $\Delta i_{14}$ can be of the order of hundreds of milliamps (as determined by $R_{16}$), resulting in high gain.

Figure 4:
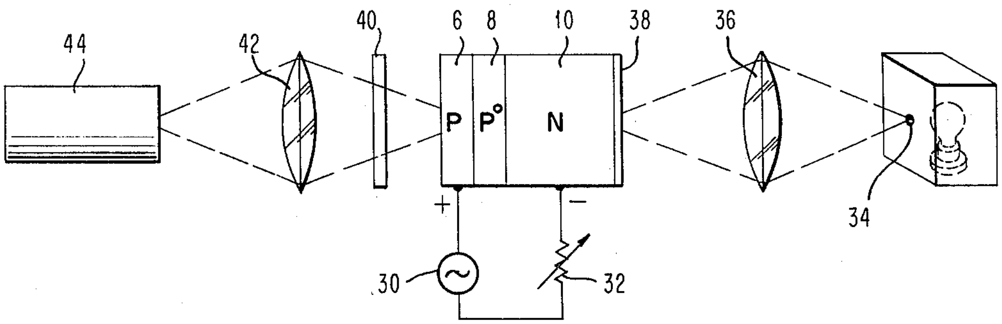
FIGURE 4 is an embodiment of the invention employed as a light amplifier.

In FIGURE 4, the light source comprising regions 10 and 12 of FIGURE 1 is replaced by an outside source of light. In this way the residue structure can be employed as a light amplifier. Elements 6, 8 and 10 are the PP°N regions that form the negative resistance electroluminescent diode of FIGURE 4, and 30 is an A.C. source E($f$) that maintains, every half cycle, a forward bias, insufficient to switch the diode without illumination on its P° region, on such diode through variable resistor 32. Light source 34 is focussed on the n-region 10 through lens 36 and 38 is a dichroic filter which transmits the wavelength $\lambda_1$ of source 34 but reflects the light of wavelength $\lambda_2$ generated within the diode. It is to be understood that the dichoic filter 28, like the reflector 24 of FIGURE 1, is an optional feature of the device and neither is necessary for the operation of the invention. Filter 40 is selected to cut out light of wavelength $\lambda_1$, but transmit light of wavelength $\lambda_2$. A lens 42 focusses the transmitted light onto detector 44.

When the external incident light $I_{ex}$ has less energy per photon than that of the emitted light $I_1$, that is, the energy of the external incident photon is less than the energy of the emitted photon, a quantum amplifier results. When Mn is used as a deep level impurity in GaAs and has an ionization energy of 0.1 ev., a quantum gain of 10 is available since the emitted photon has an energy of 1.0 ev. By varying the depth of the impurity, one may obtain less quantum gain with deep impurities and greater gain with shallower impurities. Furthermore, when the external incident light is in the infra-red region and the emitted light of the PP°N diode in the visible range, a matrix of such diodes can be employed to convert a long wavelength infra-red image into a short wavelength infra-red image. By suitably doping GaAs with a higher band gap III–IV compound, e.g., gallium phosphide, one may obtain visible images instead of images in the near infra-red.

If fewer photons per second from source 34 are needed to switch the device than are emitted from it in its high conducting state, light amplification results. In order to preserve any modulation characteristics which may be possessed by source 34, it is necessary that the bias frequency $E(f)$ of source 30 be greater than the modulation frequency of source 34. Thus, with $E(f)$ at its positive potential, and the light source 34 turned on, the threshold of diode 6–8–10 is reduced. The diode switches to its low impedance state and relatively large values of current $i_{30}$ cause light at wavelength $\lambda_2$ to be generated, which light is sensed by detector 44. When $E(f)$ drops to a point below bias potential or returns to its negative state, the diode 6–8–10 drops back to its high impedance state and the low value of $i_{30}$ causes little or no electroluminescence in the diode; consequently, no light output to detector 44. So long as source 30 has a frequency that applies a forward bias to PP°N diode at a rate greater than the rate at which source 34 is turned on and off, the circuit of FIGURE 4 acts as an amplifier which preserves the modulation characteristics of source 30. When source 34 is selected to have a wavelength $\lambda_1$ equal to $\lambda_2$, then filter 40 can be removed. The system acts as a converter when light source 34 has a wavelength $\lambda_1 > \lambda_2$, the light generated in the diode during switching. Thus, $\lambda_1$ could be in the long infra-red region, yet detector 44 would sense an infra-red whose wavelength is shorter than source 34.

In the copending application by W. P. Dumke, R. S. Levitt and K. Weiser, it was disclosed how diodes prepared by diffusing Mn into n-type GaAs followed by a much shallower Zn diffusion exhibit a negative resistance in their $i$–V characteristics at 77° K. and are electroluminescent as well. The present invention exploits this teaching in order to obtain a fast switch as well as a light amplifier. Although applicant does not wish to be limited to his explanation of the theory of operation of his invention, nevertheless it is believed that his switch operates in the following manner. The high resistivity region P°, wherein the predominant impurity is Mn, is flanked by two low resistivity regions P and N. In region P, the dominant impurity is Zn, and region N is an n-type GaAs. The high resistivity region of P° is due to the fact that at 77° K. essentially all the Mn centers in excess of those which compensate the original donors of the n-type GaAs are neutral. At low currents from battery 14 of FIGURE 1, before the onset of negative resistance, electrons traverse the P° region and combine with holes at the P—P° boundary. Observation of the origin of light in the diode while changing the voltages and currents with respect to such diode indicates that the width of the P° region is of the order of 30 microns. This thickness is not a fixed quantity but may vary from diode to diode depending upon fabrication.

When a threshold voltage is reached, using 4 volts as an example, negative resistance sets in until the voltage drops to about 2.2 volts. The $i$–V curve becomes positive again at this point and the spectral distribution and the intensity of the light as a function of the current before and after negative resistance indicates that the light emission is accompanied by a filling of the Zn centers and Mn centers with holes. It is believed that reabsorption of the recombination radiation takes place in the P° region in order to terminate the negative resistance excursion.

By employing the principles outlined above, a novel high speed solid state switching device has been attained wherein such device can be modified to serve as a light amplifier.

While the invention has been particularly shown and described with reference to preferred embodiments thereof, it will be understood by those skilled in the art that various changes in form and details may be made therein without departing from the spirit and scope of the invention.

What is claimed is:

1. A bistable asymmetrically conductive device comprising an injection luminescent diode having a p-region and an n-region and a light sensitive diode having negative resistance characteristics in intimate contact with said luminescent diode, said light sensitive diode having a p-region but the same n-region as said luminescent diode, means for biasing said light sensitive diode in its forward direction of current flow, and means for biasing said luminescent diode in its forward direction of current flow.

2. A bistable asymmetrically conductive device comprising an injection luminescent diode having a p-region and an n-region and a light sensitive diode having negative resistance characteristics in intimate contact with said luminescent diode, said light sensitive diode having a p-region but the same n-region as said luminescent diode, means for biasing both diodes in their respective forward directions of current flow, and means for removing said bias after switching of said bistable device from its high impedance state to its low impedance state.

3. A bistable asymmetrically conductive device comprising a wafer on n-type GaAs having been doped with Mn as a deep level impurity to provide a high impedance region and with Zn as a shallow level impurity to provide a low impedance region, said doping providing two diodes wherein one diode is a light-sensitive negative resistance diode having a voltage threshold for switching it from its high impedance condition to its low impedance condition consisting of a low impedance region P where the main impurity in the GaAs is Zn, a high impedance region P° where the main impurity in the GaAs is Mn and the n-type GaAs region, and said second diode being an injection luminescent diode consisting of said n-type GaAs region and a low impedance region P where the main impurity in said GaAs is Zn, means for biasing said light sensitive diode in its forward current-conducting direction, and further means for biasing said luminescent diode in its forward current-conducting direction whereby light given off by said luminescent diode will impinge upon said light-sensitive diode and lower its voltage threshold.

4. The bistable asymmetrically conductive device of claim 3 wherein a light-reflector layer is placed on said injection luminescent diode so as to reflect any light emitted by said luminescent diode toward said light-sensitive negative resistance diode.

5. A light amplifier circuit comprising a body of n-type GaAs, a high impedance region comprising Mn diffused as an impurity into said GaAs body, a low impedance region comprising Zn diffused as an impurity into said GaAs body, said Mn being diffused more deeply into the GaAs body than the Zn, means for applying a bias in the forward direction of current flow through the diode formed by the GaAs body, the high impedance region and low impedance region, said bias being insufficient to cause appreciable current flow through said diode, means for shining light energy onto said GaAs body whereby said bias now becomes sufficient to cause said diode to conduct current appreciably and emit light as a consequence of such change in conductivity of said diode, and means for detecting said emitted light.

6. A light amplifier circuit as set forth in claim 5 including means for lowering the bias across said diode below its threshold voltage after said diode has switched to its high current-conducting state.

7. A light amplifier circuit as set forth in claim 5 wherein the light energy applied to said GaAs body has a wavelength that is longer than the wavelength emitted by said diode.

8. A light amplifier circuit as set forth in claim 5 wherein the light energy applied to said GaAs body has a wavelength that is substantially the same as that emitted by said diode.

9. A light amplifier circuit comprising a body of n-type gallium arsenide, a high impedance region comprising chromium diffused as an impurity into said gallium arsenide body, a low impedance region comprising zinc diffused as an impurity into said gallium arsenide body, said chromium being diffused more deeply into the gallium arsenide body than the zinc, means for applying a bias in the forward direction of current flow through the diode formed by the gallium arsenide body, the high impedance region and low impedance region, said bias being insufficient to cause appreciable current flow through said diode, means for shining light energy onto said gallium arsenide body whereby said bias now becomes sufficient to cause said diode to conduct current appreciably and emit light as a consequence of said change in conductivity of said diode, and means for detecting said emitted light.

10. A light amplifier circuit comprising a body and n-type gallium arsenide, a high impedance region comprising chromium diffused as an impurity into said gallium arsenide body, a low impedance region comprising cadmium diffused as an impurity into said gallium arsenide body, said chromium being diffused more deeply into the gallium arsenide body than the cadmium, means for applying a bias in the forward direction of current flow through the diode formed by the gallium arsenide body, the high impedance region and the low impedance region, said bias being insufficient to cause appreciable current flow through said diode, means for shining light energy onto said gallium arsenide body whereby said bias now becomes sufficient to cause said diode to conduct current appreciably and emit light as a consequence of said change in conductivity of said diode, and means for detecting said emitted light.

References Cited by the Examiner

UNITED STATES PATENTS

| | | | |
|---|---|---|---|
| 3,043,958 | 7/1962 | Diemer | 250—211 |
| 3,043,959 | 7/1962 | Diemer | 250—211 |
| 3,054,033, | 9/1962 | Iwama et al. | 307—88.5 |
| 3,064,132 | 11/1962 | Strull | 250—211 |
| 3,102,201 | 8/1963 | Braunstein et al. | 250—211 |
| 3,134,905 | 5/1964 | Pfann | 317—235 |
| 3,170,067 | 2/1965 | Kibler | 317—235 |

RALPH G. NILSON, *Primary Examiner.*

M. A. LEAVITT, *Assistant Examiner.*